(12) United States Patent
Matsumoto et al.

(10) Patent No.: US 12,096,643 B2
(45) Date of Patent: Sep. 17, 2024

(54) SOLID-STATE IMAGE SENSOR AND ELECTRONIC APPARATUS

(71) Applicant: SONY SEMICONDUCTOR SOLUTIONS CORPORATION, Kanagawa (JP)

(72) Inventors: Akira Matsumoto, Kanagawa (JP); Hiroshi Tayanaka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/842,183

(22) Filed: Jun. 16, 2022

(65) Prior Publication Data

US 2022/0310699 A1    Sep. 29, 2022

Related U.S. Application Data

(62) Division of application No. 16/325,047, filed as application No. PCT/JP2017/029494 on Aug. 17, 2017, now Pat. No. 11,404,483.

(30) Foreign Application Priority Data

Aug. 30, 2016 (JP) ................................ 2016-167591

(51) Int. Cl.
*H01L 27/30* (2006.01)
*H01L 27/146* (2006.01)
(Continued)

(52) U.S. Cl.
CPC ....... *H10K 39/32* (2023.02); *H01L 27/14612* (2013.01); *H01L 27/14643* (2013.01);
(Continued)

(58) Field of Classification Search
CPC .............. H10K 39/32; H01L 27/14612; H01L 27/14625; H01L 27/14629; H01L 27/1464;
(Continued)

(56) References Cited

U.S. PATENT DOCUMENTS

2007/0170478 A1    7/2007  Araki
2010/0123070 A1*   5/2010  Natori ............... H04N 23/11
                                              250/226
(Continued)

FOREIGN PATENT DOCUMENTS

CN    102290424 A    12/2011
CN    102387324 A    3/2012
(Continued)

OTHER PUBLICATIONS

International Search Report and Written Opinion of PCT Application No. PCT/JP2017/029494, issued on Nov. 7, 2017, 12 pages of English Translation and 09 pages of ISRWO.
(Continued)

*Primary Examiner* — Cuong B Nguyen
(74) *Attorney, Agent, or Firm* — CHIP LAW GROUP

(57) ABSTRACT

This technology relates to a solid-state image sensor configured to make smaller the chip size of a CIS that uses an organic photoelectric conversion film, and to an electronic apparatus. A solid-state image sensor according to a first aspect of this technology is characterized in that it includes a first substrate and a second substrate stacked one on top of the other and a first organic photoelectric conversion film formed on the first substrate and that a latch circuit is formed on the second substrate. This technology may be applied to back-illuminated CISs, for example.

11 Claims, 15 Drawing Sheets

(51) Int. Cl.
  *H04N 25/70* (2023.01)
  *H04N 25/772* (2023.01)
  *H04N 25/79* (2023.01)
  *H10K 39/32* (2023.01)

(52) U.S. Cl.
  CPC .......... *H04N 25/70* (2023.01); *H04N 25/772* (2023.01); *H04N 25/79* (2023.01)

(58) Field of Classification Search
  CPC . H01L 25/043; H01L 25/0657; H01L 25/167; H01L 31/107; H01L 27/14643–14663; H04N 25/70; H04N 25/772; H04N 25/79; H04N 25/17; H04N 25/76
  See application file for complete search history.

(56) References Cited

U.S. PATENT DOCUMENTS

| | | |
|---|---|---|
| 2011/0310282 A1 | 12/2011 | Toda et al. |
| 2012/0057056 A1 | 3/2012 | Oike |
| 2015/0163403 A1* | 6/2015 | Wakabayashi .... H01L 27/14643 348/308 |
| 2015/0163433 A1 | 6/2015 | Uchida et al. |
| 2016/0182842 A1 | 6/2016 | Mabuchi |
| 2017/0141312 A1 | 5/2017 | Enoki |
| 2017/0170239 A1* | 6/2017 | Lee .................. H01L 27/14689 |
| 2017/0207158 A1 | 7/2017 | Kang et al. |
| 2018/0175083 A1 | 6/2018 | Takahashi |

FOREIGN PATENT DOCUMENTS

| | | |
|---|---|---|
| CN | 105379249 A | 3/2016 |
| CN | 106663686 A | 5/2017 |
| CN | 107112342 A | 8/2017 |
| EP | 2398054 A2 | 12/2011 |
| EP | 3032822 A1 | 6/2016 |
| JP | 2007-082063 A | 3/2007 |
| JP | 2007-201009 A | 8/2007 |
| JP | 2012-004443 A | 1/2012 |
| JP | 2012-054876 A | 3/2012 |
| JP | 2016-009722 A | 1/2016 |
| JP | 2016-134587 A | 7/2016 |
| KR | 10-2011-0138159 A | 12/2011 |
| KR | 10-2012-0023547 A | 3/2012 |
| KR | 10-2016-0040139 A | 4/2016 |
| KR | 10-2017-0020773 A | 2/2017 |
| TW | 201210004 A | 3/2012 |
| TW | 201220484 A | 5/2012 |
| TW | 201507472 A | 2/2015 |
| WO | 2015/019836 A1 | 2/2015 |
| WO | 2015/198697 A1 | 12/2015 |
| WO | 2016/117381 A1 | 7/2016 |

OTHER PUBLICATIONS

Notice of Allowance for U.S. Appl. No. 16/325,047, issued on Mar. 16, 2022, 8 pages.

Non-Final Office Action for U.S. Appl. No. 16/325,047, issued on Nov. 12, 2021, 12 pages.

International Preliminary Report on Patentability of PCT Application No. PCT/JP2017/029494, issued on Mar. 14, 2019, 12 pages of English Translation and 06 pages of IPRP.

* cited by examiner

SOLID-STATE IMAGE SENSOR AND ELECTRONIC APPARATUS

CROSS REFERENCE TO RELATED APPLICATIONS

This application is a divisional application of U.S. patent application Ser. No. 16/325,047, filed on Feb. 12, 2019, is a U.S. National Phase of International Patent Application No. PCT/JP2017/029494 filed on Aug. 17, 2017, which claims priority benefit of Japanese Patent Application No. JP 2016-167591 filed in the Japan Patent Office on Aug. 30, 2016. Each of the above-referenced applications is hereby incorporated herein by reference in its entirety.

TECHNICAL FIELD

The present technology relates to a solid-state image sensor and an electronic apparatus. More particularly, the technology relates to a solid-state image sensor configured to be put in a smaller-sized chip in the case of using an organic photoelectric conversion film as a light receiving element and to an electronic apparatus.

BACKGROUND ART

Heretofore, CMOS image sensors (CIS) that use an organic photoelectric conversion film as a light receiving element and operate under column ADC control have been proposed (e.g., see Patent Literature 1).

CITATION LIST

Patent Literature

[PTL 1]
Japanese Patent Laid-open No. 2007-82063

SUMMARY

Technical Problem

In the case of existing CISs under column ADC control, photodiodes (PD) and source follower circuits are formed on a silicon substrate immediately below the organic photoelectric conversion film. Analog-to-digital converters (ADC) and latch circuits that perform processes downstream are arranged in peripheral regions away from immediately below the organic photoelectric conversion film. This arrangement makes the CIS chip bulkier in size and lowers theoretical yield at manufacturing time.

The present technology has been devised in view of the above circumstances. An object of the technology is therefore to make smaller the chip size of a CIS that uses an organic photoelectric conversion film as a light receiving element.

Solution to Problem

According to a first aspect of the present technology, there is provided a solid-state image sensor including: a first substrate and a second substrate configured to be stacked one on top of the other; and a first organic photoelectric conversion film configured to be formed on the first substrate. The second substrate has a latch circuit formed thereon.

The solid-state image sensor according to the first aspect of the present technology may further include a photoelectric conversion section configured to be sensitive to a wavelength band different from another wavelength band to which the first organic photoelectric conversion film is sensitive.

The photoelectric conversion section includes a second organic photoelectric conversion film sensitive to a wavelength band different from the wavelength band to which the first organic photoelectric conversion film is sensitive, and may be formed on the first substrate.

The photoelectric conversion section includes a PD sensitive to a wavelength band different from the wavelength band to which the first organic photoelectric conversion film is sensitive, and may be formed inside the first substrate.

A pixel transistor corresponding to the first organic photoelectric conversion film may be formed inside the first substrate.

An ADC circuit corresponding to the first organic photoelectric conversion film may be formed inside the first substrate.

The pixel transistor and the ADC circuit corresponding to the first organic photoelectric conversion film may be used exclusively by a single pixel.

The pixel transistor and the ADC circuit corresponding to the first organic photoelectric conversion film may be shared by multiple pixels.

The pixel transistor corresponding to the first organic photoelectric conversion film may include a reset transistor, an amplification transistor, and a selection transistor.

The reset transistor may be configured to operate by a GND RST scheme.

The reset transistor may be configured to operate by a Vdd RST scheme.

The pixel transistor corresponding to the first organic photoelectric conversion film may further include a transfer transistor.

The transfer transistor may be formed for each pixel. The reset transistor, the amplification transistor, and the selection transistor may be shared by multiple pixels.

The solid-state image sensor according to the first aspect of the present technology may further include a third substrate stacked on a side of the second substrate.

According to a second aspect of the present technology, there is provided an electronic apparatus including a solid-state image sensor. The solid-state image sensor includes: a first substrate and a second substrate configured to be stacked one on top of the other; and a first organic photoelectric conversion film configured to be formed on the first substrate. The second substrate has a latch circuit formed thereon.

Advantageous Effects of Invention

According to the first aspect of the present technology, the chip size can be made smaller.

According to the second aspect of the present technology, the use of a smaller-sized solid-state image sensor can make the electronic apparatus also smaller in size.

DESCRIPTION OF EMBODIMENTS

The best modes for carrying out the present technology (referred to as the embodiments hereunder) are described below in detail with reference to the accompanying drawings.

Solid-State Image Sensor Embodying the Present Technology

A solid-state image sensor to which the present technology is applied is a back-illuminated CIS. This CIS is characterized in that it has multiple silicon substrates (first and second substrates) stacked one on top of the other and that an organic photoelectric conversion film is further stacked over the first substrate.

In the process of manufacturing the solid-state image sensor, once the organic photoelectric conversion film is stacked on the first substrate, these components cannot be subjected to high temperature. That means the materials to be formed over the organic photoelectric conversion film, such as a passivation film, a color filter (CF), and an on-chip lens (OCL) need to be processed at low temperatures of approximately 200° C. or less.

Figure 1:
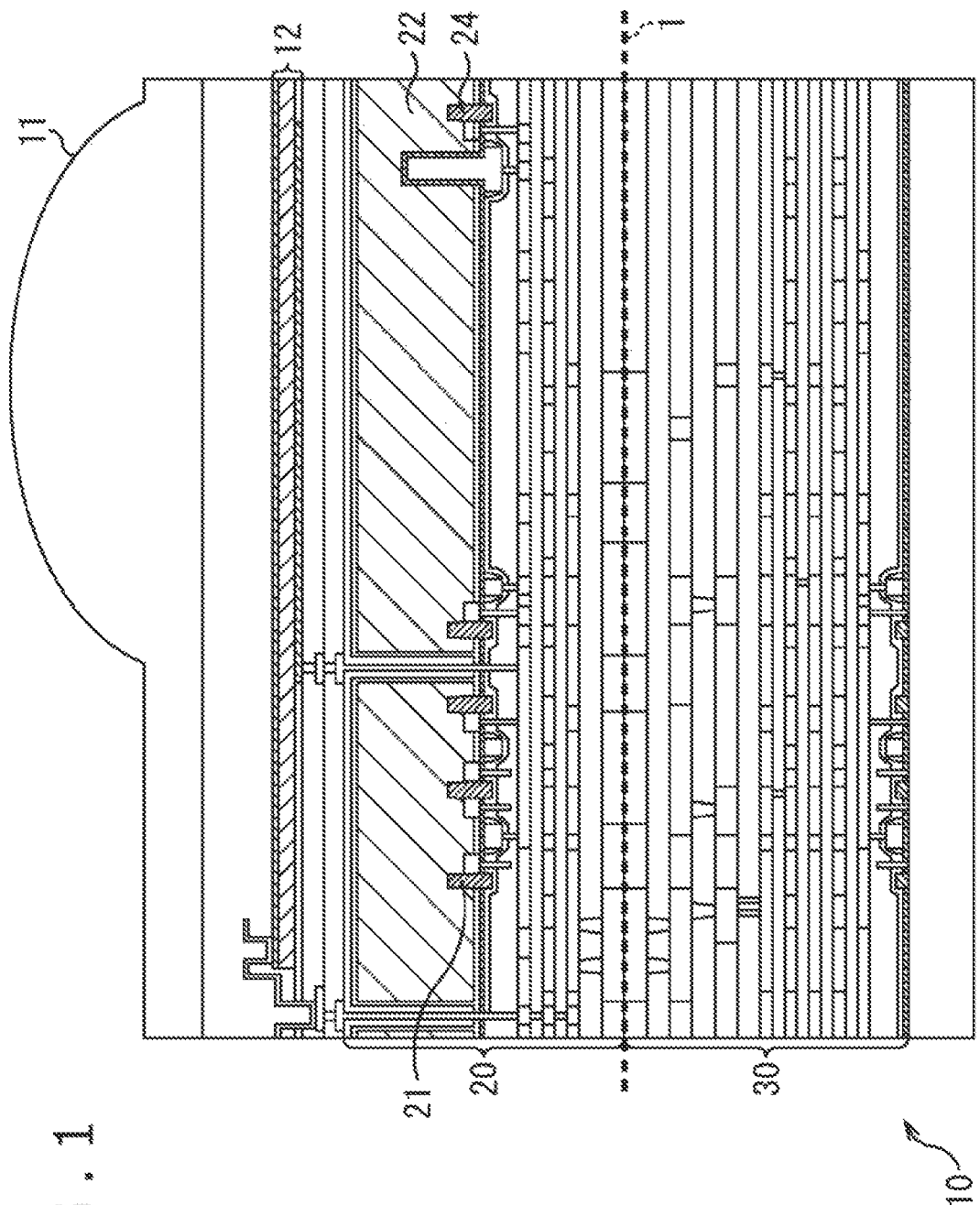
FIG. 1 is a cross-sectional diagram depicting a first configuration example of a solid-state image sensor to which the present technology is applied.
Figure 2:
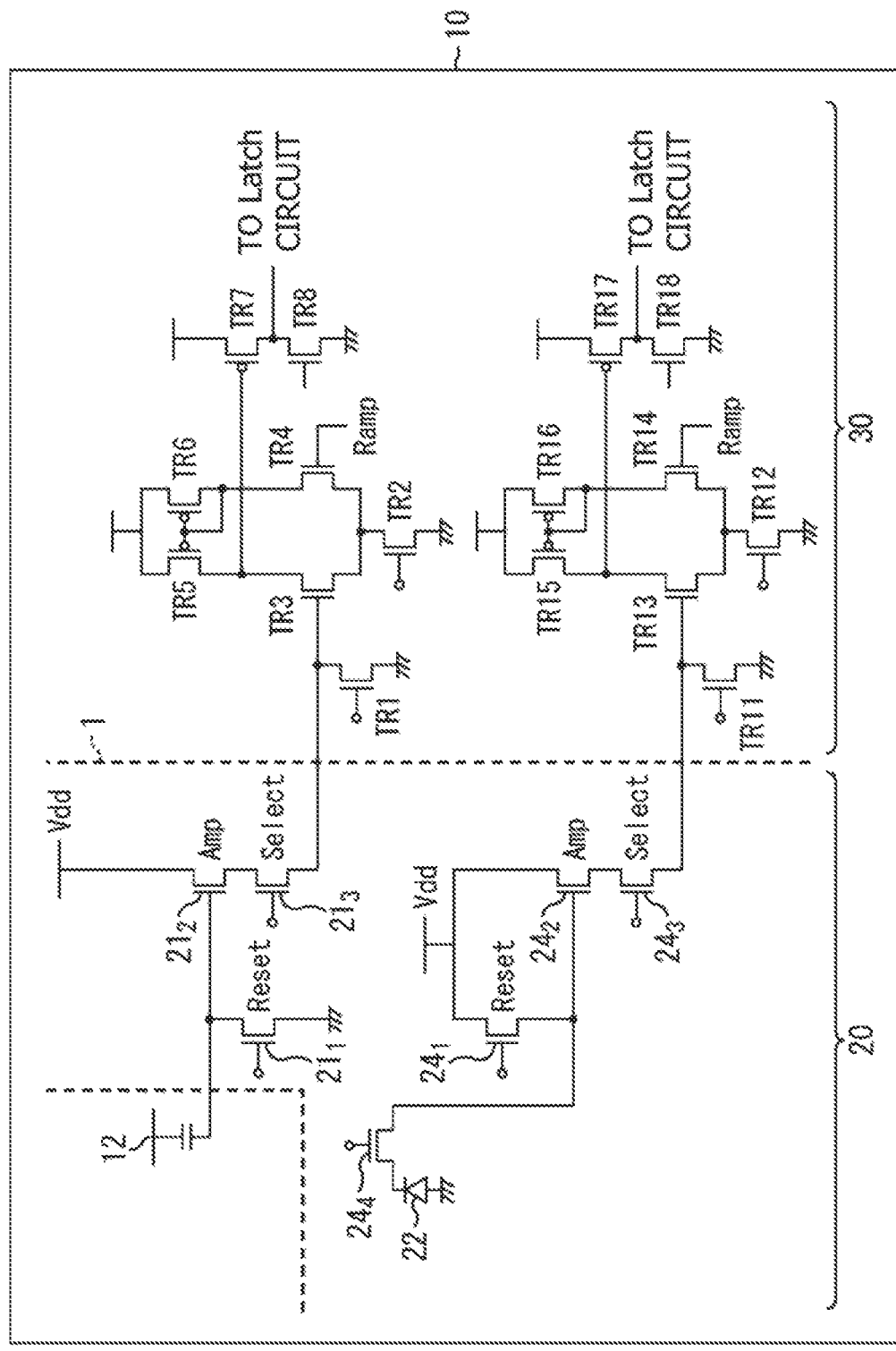
FIG. 2 is an equivalent circuit diagram corresponding to the first configuration example of the solid-state image sensor.

First Configuration Example of the Solid-State Image Sensor Embodying the Present Technology FIG. 1 is a cross-sectional diagram depicting a first configuration example of a solid-state image sensor 10 regarding a single pixel to which the present technology is applied. FIG. 2 is an equivalent circuit diagram corresponding to the first configuration example regarding a single pixel.

The first configuration example includes, from the top of the figure where incident light enters toward the bottom, an OCL 11, an organic photoelectric conversion film 12, a first substrate 20, and a third substrate 30.

The organic photoelectric conversion film 11 is sensitive only to a predetermined wavelength band of the incident light (e.g., green (G) wavelength band) condensed by the OCL 11. Through photoelectric conversion, the organic photoelectric conversion film generates electrical charges reflecting the incident light.

The first substrate 20 and the second substrate 30 are electrically interconnected at junctions disposed on a boundary 1 indicated by the broken line in the figure.

Formed on the first substrate 20 are a pixel transistor (Tr.) 21 forming a source follower circuit of the organic photoelectric conversion film 11, a PD 22, and a pixel transistor 24 constituting a source follower circuit of the PD 22.

The pixel transistor 21 includes a reset transistor 211 that connects a floating diffusion (FD) storing the electrical charges generated by the organic photoelectric conversion film 11 to ground for reset purposes, an amplification transistor 212 that converts the electrical charges stored in the FD into a voltage, and a selection transistor 213 that outputs the converted analog voltage to a downstream stage.

The PD 22 is sensitive only to a predetermined wavelength band (e.g., blue (B) wavelength band) different from the wavelength band to which the organic photoelectric conversion film 11 is sensitive. Through photoelectric conversion, the PD 22 generates electrical charges reflecting the incident light.

The pixel transistor 24 includes a reset transistor 241 that connects the FD storing the electrical charges generated by the PD 22 to Vdd for reset purposes, an amplification transistor 242 that converts the electrical charges stored in the FD into a voltage, a selection transistor 243 that outputs the converted analog voltage to a downstream stage, and a transfer transistor 244 that reads the electrical charges from the PD 22.

Formed on the second substrate 30 are an ADC circuit 31 that converts the analog voltage input via the pixel transistor 21 from analog to digital form, and an ADC circuit 32 that converts the analog voltage input via the pixel transistor 24 from analog to digital form. Also formed on the second substrate 30 are latch circuits (not depicted) downstream of the ADC circuits 31 and 32.

In the case of the first configuration example, the source follower circuits are formed on one substrate whereas the ADC circuits and latch circuits downstream of the source follower circuits are formed on a different substrate, the substrates being stacked one on top of the other. This makes it possible to make smaller the chip size of the solid-state image sensor 10, thereby improving theoretical yield at manufacturing time.

Although the first configuration example permits acquisition of more color information per area where the organic photoelectric conversion film 12 and the PD 22 are formed in each pixel, the number of read operations is that much larger. In the case of the first configuration example, one color is read by the organic photoelectric conversion film 12 and another color by the PD 22. As a result, the analog power consumption required by the read operations is twice that of a Bayer-array-type solid-state image sensor that reads one color from a single pixel. Furthermore, in the case where no transfer transistor is disposed for the organic photoelectric conversion film 12 so that the organic photoelectric conversion film 12 connects directly with the FD, two read operations from the FD are needed to cancel kTC noise. With these read operations added up, the analog power consumption becomes three times that of the Bayer-array-type solid-state image sensor.

The organic photoelectric conversion film 12 consumes more power than the PD 22. This requires providing some measures to save power.

In the case of the first configuration example, each pixel is provided with the ADC circuit 31 corresponding to the organic photoelectric conversion film 12 and the ADC circuit 32 corresponding to the PD 22. Thus, power consumption can be reduced by controllably driving the pixels of a limited region (e.g., the region where the target object is moving) only as needed.

Figure 3:
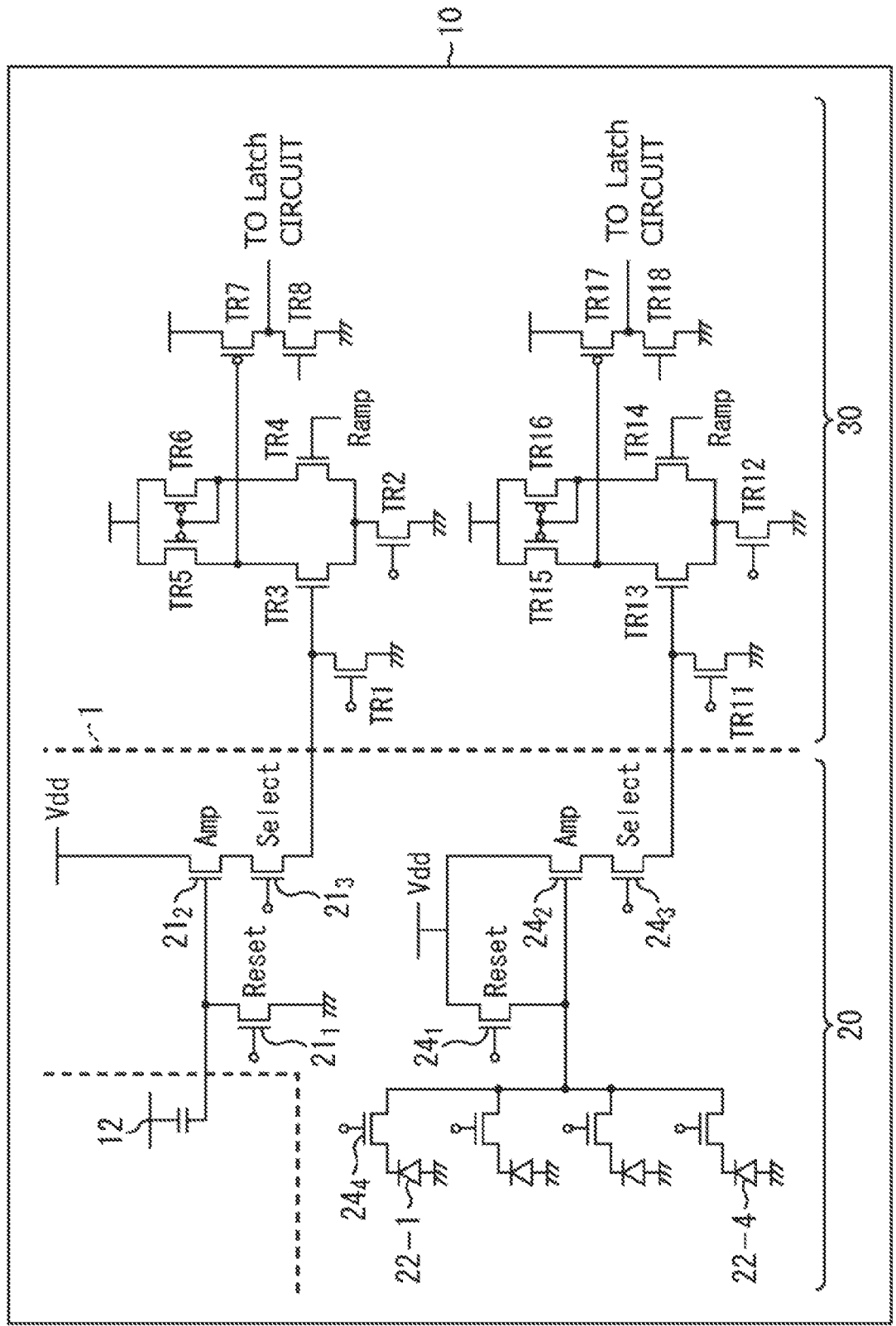
FIG. 3 is an equivalent circuit diagram corresponding to a second configuration example of the solid-state image sensor.

Second Configuration Example of the Solid-State Image Sensor Embodying the Present Technology FIG. 3 is an equivalent circuit diagram corresponding to a second configuration example of the solid-state image sensor 10 to which the present technology is applied.

The second configuration example is in common with the first configuration example with regard to the organic photoelectric conversion film 12 and its source follower circuit, except that the source follower circuit for the PD 22 and the components downstream thereof are shared by PDs 22-1 to 22-4 for four pixels.

The second configuration example provides effects similar to those of the above-described first configuration example. Further, because the source follower circuit and the components downstream thereof are shared by the PDs 22-1 to 22-4 for four pixels, the chip size can be made that much smaller. This can also improve theoretical yield at manufacturing time.

Incidentally, the number of pixels sharing the source follower circuit for the PD 22 and the components downstream thereof is not limited to 4. The sharing pixel count may be a desired number of at least 2 depending on design constraints and the like.

Figure 4:
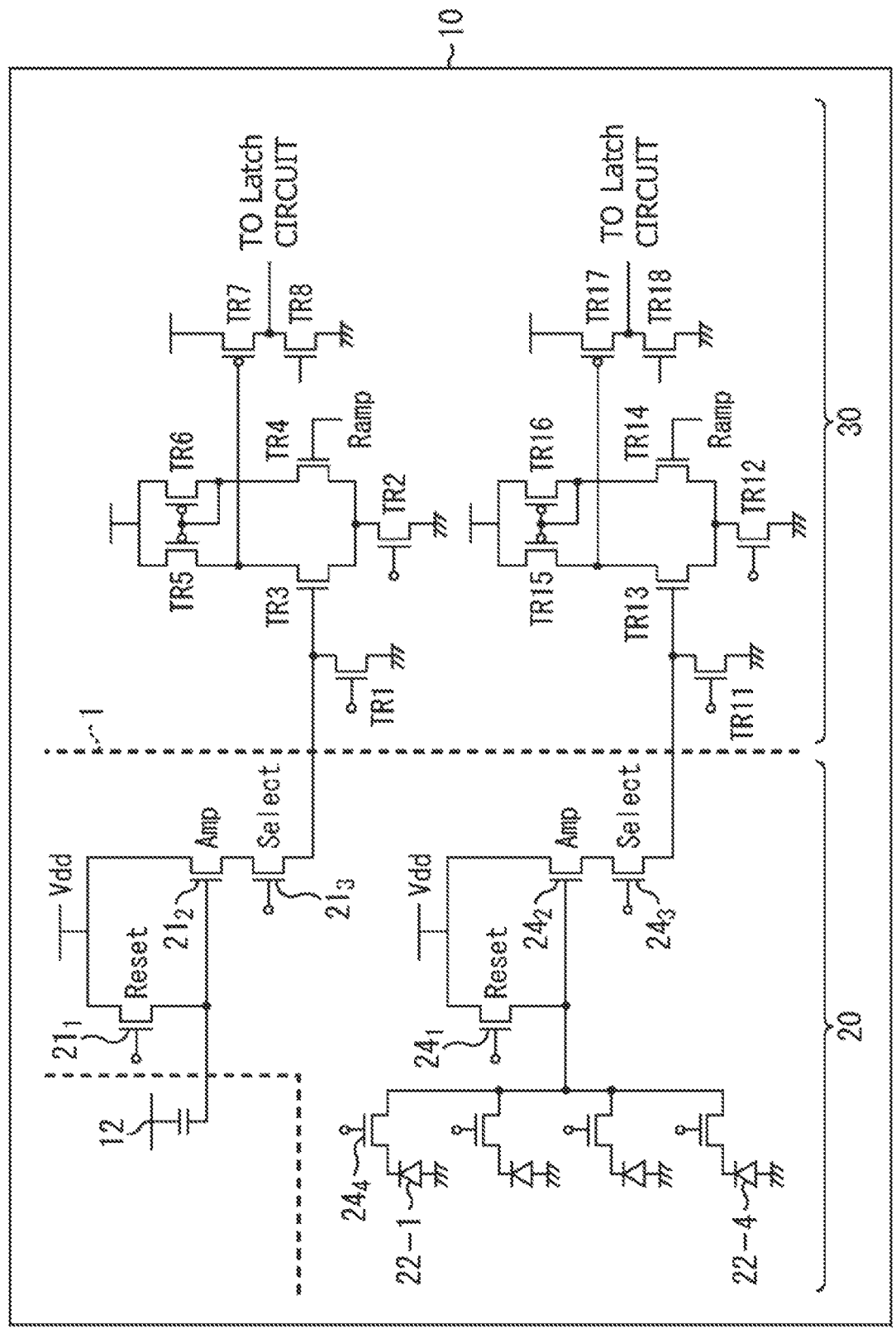
FIG. 4 is an equivalent circuit diagram corresponding to a third configuration example of the solid-state image sensor.

Third Configuration Example of the Solid-State Image Sensor Embodying the Present Technology FIG. 4 is an equivalent circuit diagram corresponding to a third configuration example of the solid-state image sensor 10 to which the present technology is applied.

The third configuration example is obtained when the reset transistor 211 in the above-described second configuration example is reconfigured to operate by a Vdd RST scheme. That is, in the third configuration example, the FD storing the electrical charges generated by the organic photoelectric conversion film 11 is reset when connected to Vdd via the reset transistor 211. The rest of the third configuration example is similar to the second configuration example.

The third configuration example provides effects similar to those of the above-described second configuration example.

Figure 5:
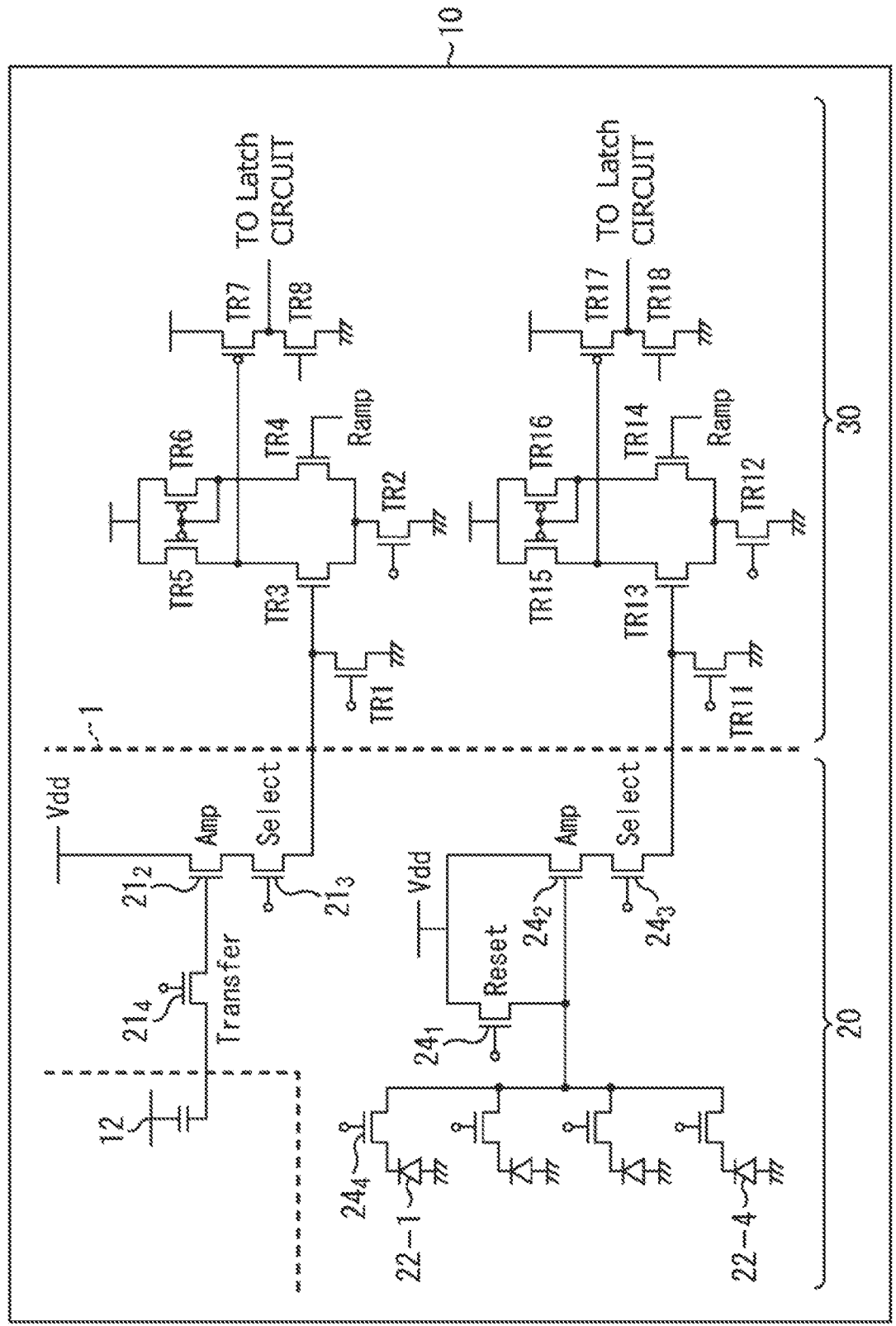
FIG. 5 is an equivalent circuit diagram corresponding to a fourth configuration example of the solid-state image sensor.

Fourth Configuration Example of the Solid-State Image Sensor Embodying the Present Technology FIG. 5 is an equivalent circuit diagram corresponding to a fourth configuration example of the solid-state image sensor 10 to which the present technology is applied.

The fourth configuration example is obtained when a transfer transistor 214 for reading the electrical charges from the organic photoelectric conversion film 12 is added to the above-described third configuration example. The rest of the fourth configuration example is similar to the third configuration example.

The fourth configuration example provides effects similar to those of the above-described third configuration example. Furthermore, with the transfer transistor 214 added, it is sufficient that the FD corresponding to the organic photoelectric conversion film 12 is read only once. This translates into reduced analog power consumption compared with the third configuration example.

Figure 6:
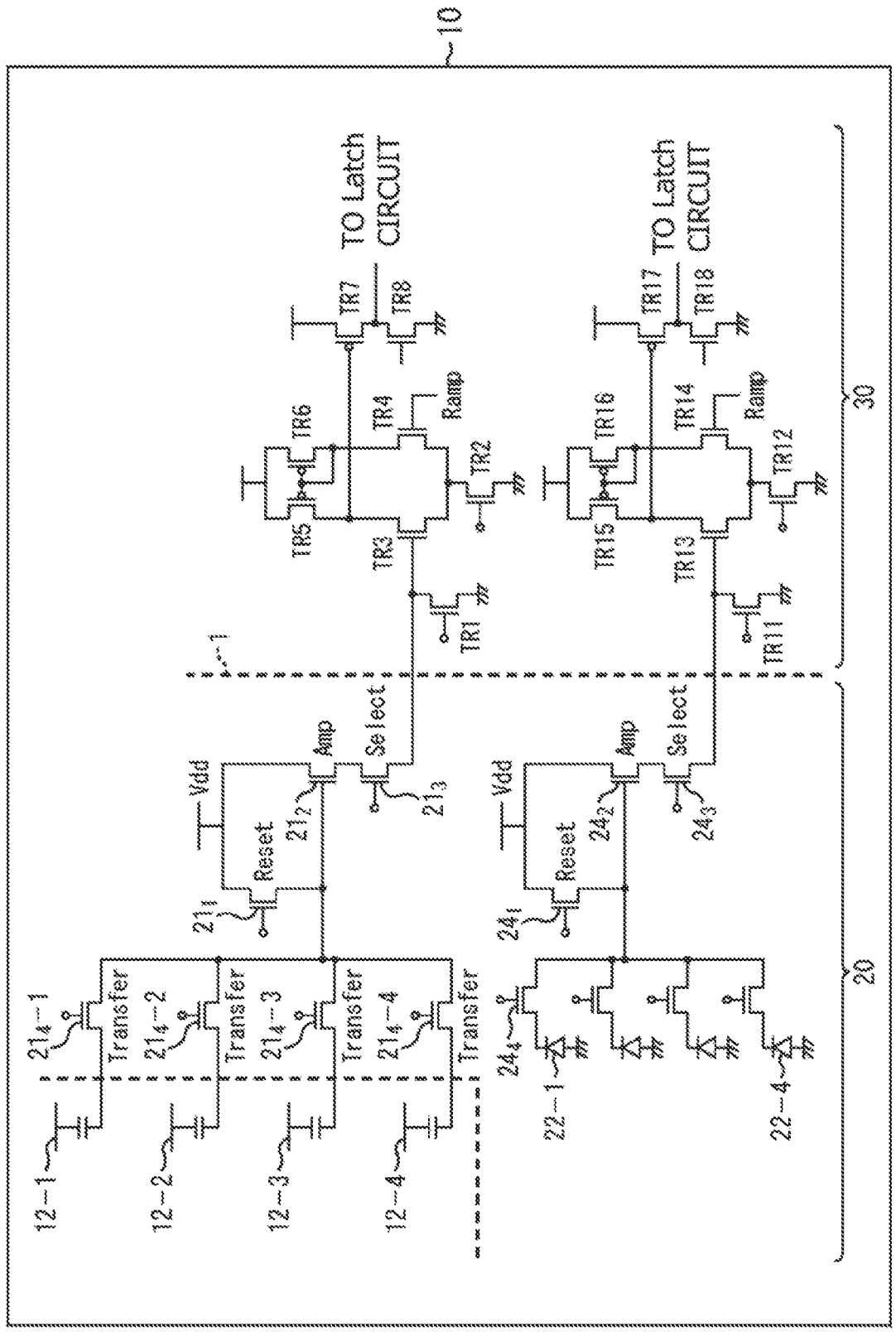
FIG. 6 is an equivalent circuit diagram corresponding to a fifth configuration example of the solid-state image sensor.

Fifth Configuration Example of the Solid-State Image Sensor Embodying the Present Technology FIG. 6 is an equivalent circuit diagram corresponding to a fifth configuration example of the solid-state image sensor 10 to which the present technology is applied.

In contrast to the above-described third configuration example, the fifth configuration example is configured such that the source follower circuit for the organic photoelectric conversion film 12 and the components downstream thereof are shared by organic photoelectric conversion films 12-1 to 12-4 for four pixels.

The fifth configuration example provides effects similar to those of the above-described third configuration example. Furthermore, because the source follower circuit and the components downstream thereof are shared by the organic photoelectric conversion films 12-1 to 12-4 for four pixels, the chip size can be made that much smaller. This can also improve theoretical yield at manufacturing time.

Incidentally, the number of pixels sharing the source follower circuit for the organic photoelectric conversion film 12 and the components downstream thereof is not limited to 4. The sharing pixel count may be a desired number of at least 2 depending on design constraints and the like.

Figure 7:
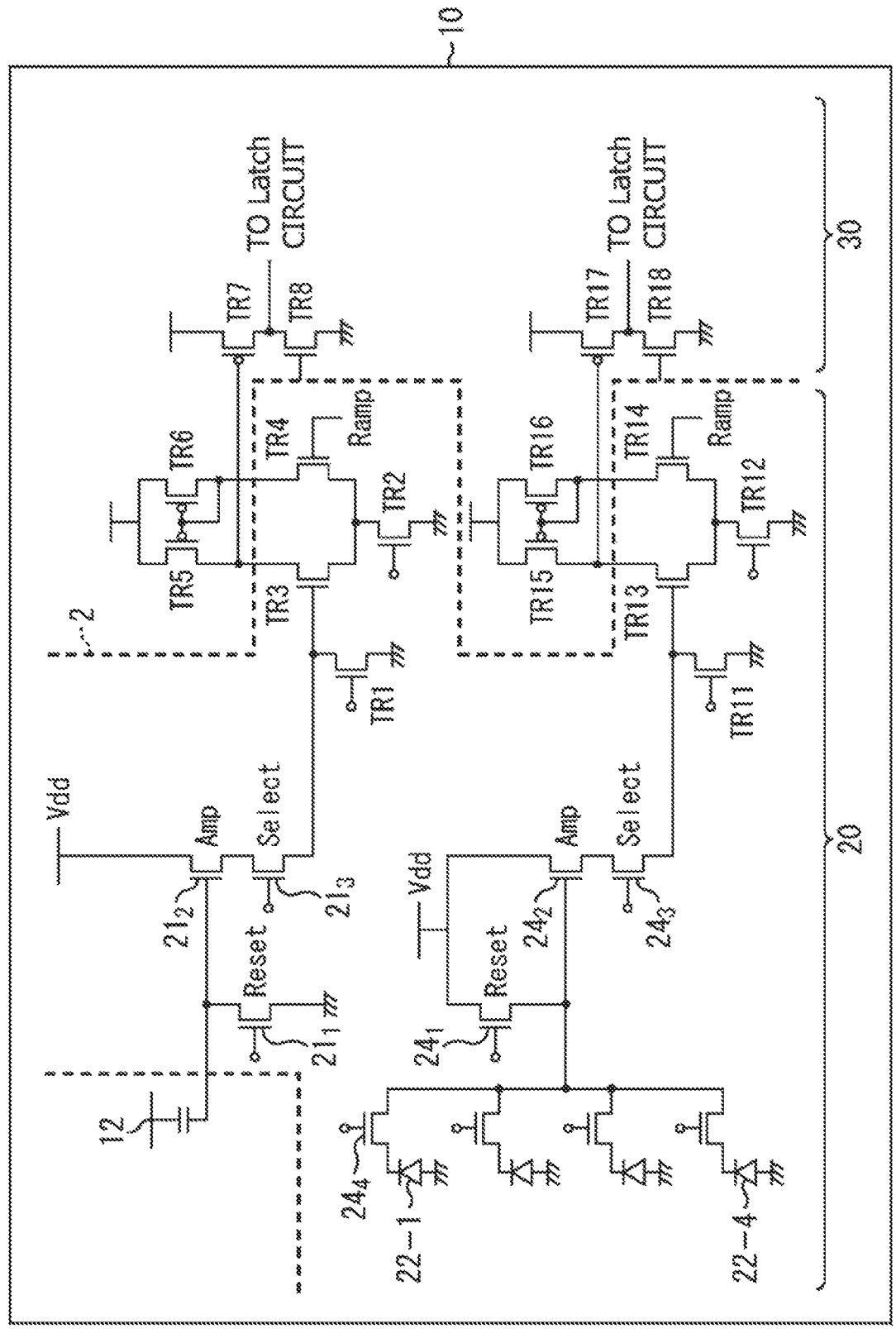
FIG. 7 is an equivalent circuit diagram corresponding to a sixth configuration example of the solid-state image sensor.

Sixth Configuration Example of the Solid-State Image Sensor Embodying the Present Technology FIG. 7 is an equivalent circuit diagram corresponding to a sixth configuration example of the solid-state image sensor 10 to which the present technology is applied.

The sixth configuration example is in common with the above-described second configuration example with respect to the components, except that the junctions between the first substrate 20 and the second substrate 30 in the second configuration example are disposed on the boundary 1 whereas the junctions in the sixth configuration example are disposed on a boundary 2. That is, the sixth configuration example has part of the ADC circuits 31 and 32 formed on the first substrate 20. The rest of the ADC circuits 31 and 32 and the components downstream thereof are formed on the second substrate 30.

The sixth configuration example provides effects similar to those of the above-described second configuration example.

Figure 8:
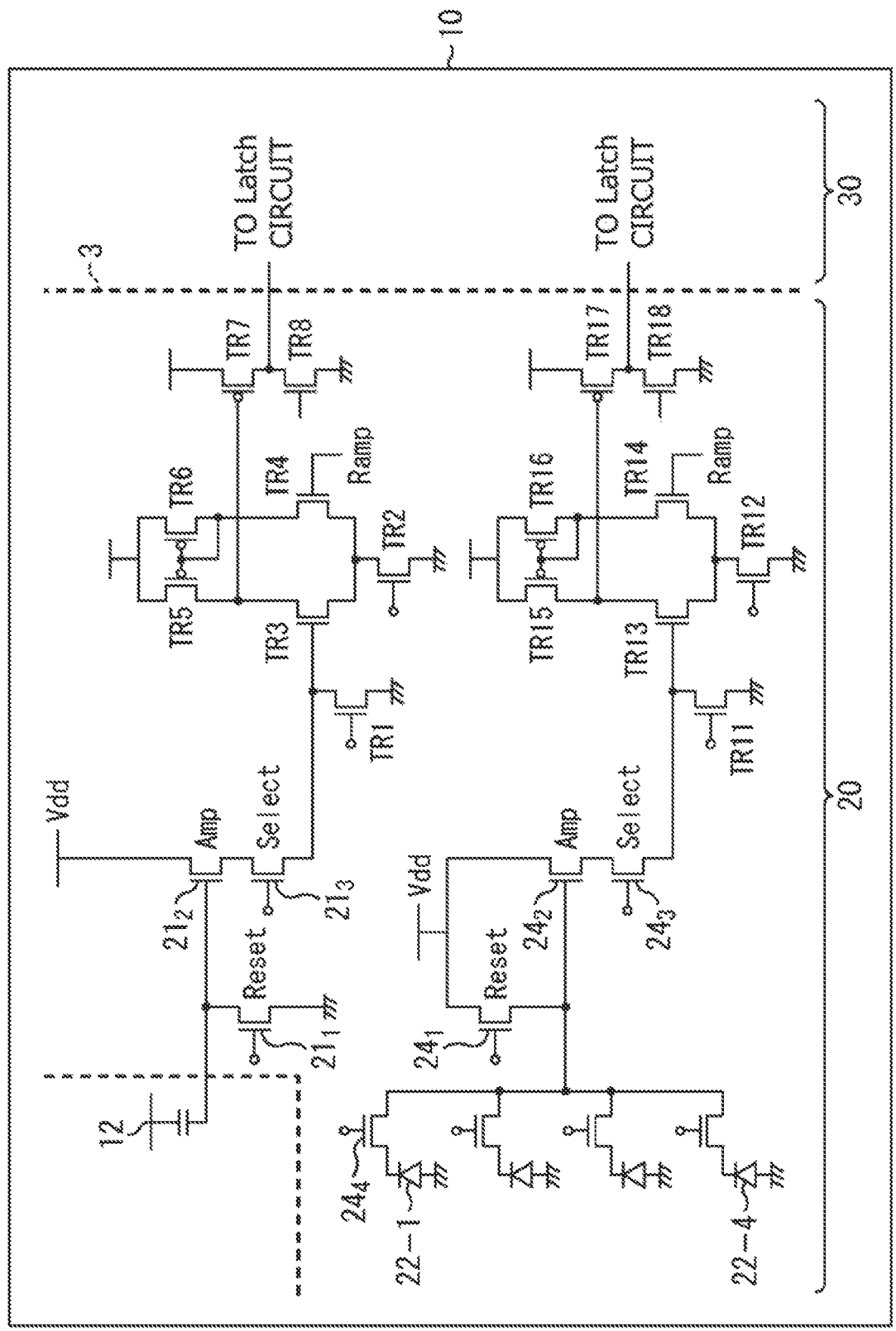
FIG. 8 is an equivalent circuit diagram corresponding to a seventh configuration example of the solid-state image sensor.

Seventh Configuration Example of the Solid-State Image Sensor Embodying the Present Technology FIG. 8 is an equivalent circuit diagram corresponding to a seventh configuration example of the solid-state image sensor 10 to which the present technology is applied.

The seventh configuration example is in common with the above-described second and sixth configuration examples with respect to the components, except that in the second configuration example, the junctions between the first substrate 20 and the second substrate 30 are disposed on a boundary 3. That is, the seventh configuration example has the ADC circuits 31 and 32 formed on the first substrate 20. The latch circuits (not depicted) and other components downstream of the ADC circuits 31 and 32 are formed on the second substrate 30.

The seventh configuration example provides effects similar to those of the above-described second configuration example.

Incidentally, the boundary between the first substrate 20 and the second substrate 30 is not limited to the boundary 1 in the first to the fifth configuration examples, to the boundary 2 in the sixth configuration example, or to the boundary 3 in the seventh configuration example. The boundary between the substrates may be located wherever desired.

Figure 9:
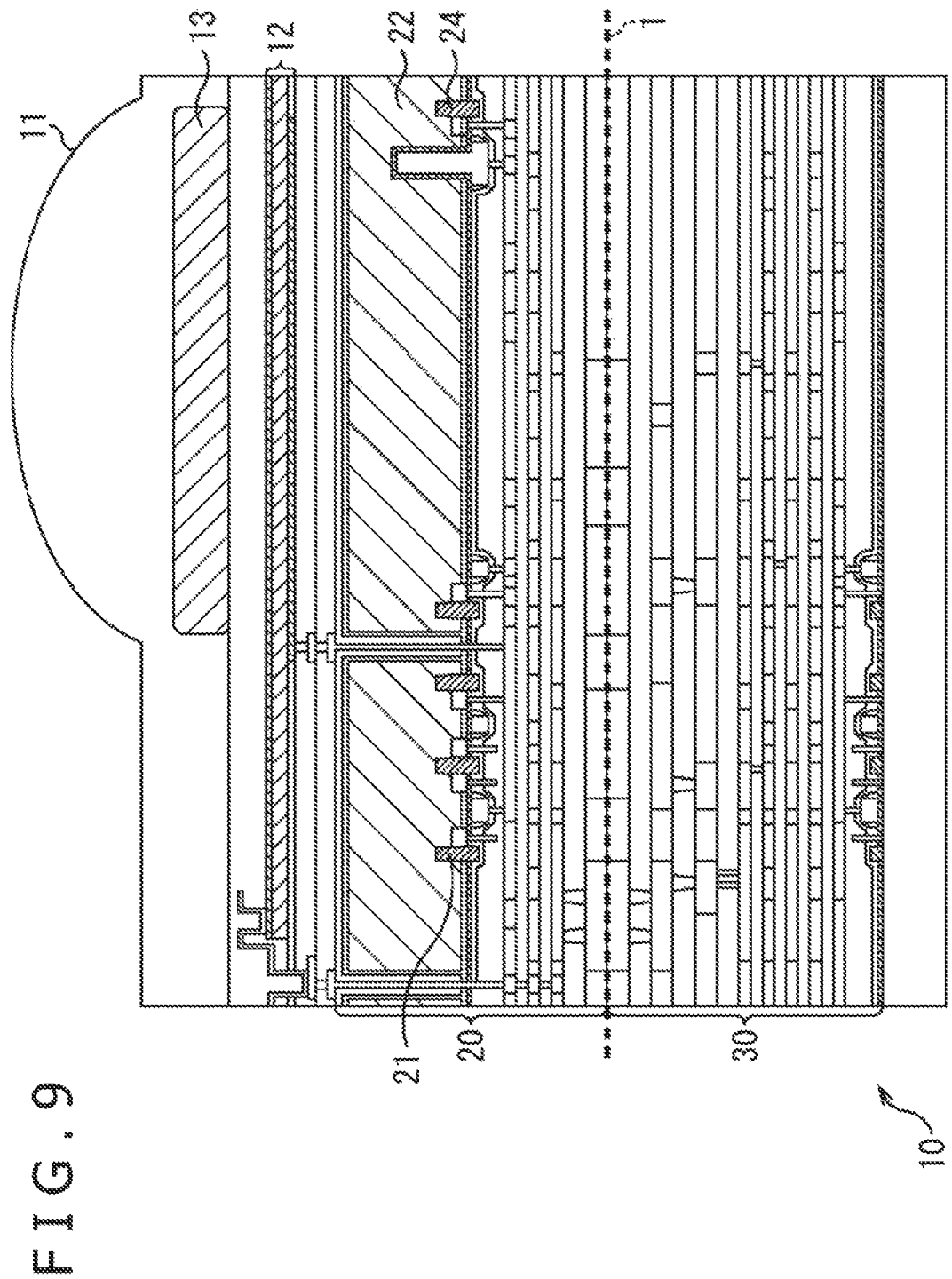
FIG. 9 is a cross-sectional diagram depicting a first alternative example to the first configuration example of the solid-state image sensor.

First Alternative Example to the First Configuration Example of the Solid-State Image Sensor Embodying the Present Technology FIG. 9 is a cross-sectional diagram depicting a first alternative example to the first configuration example of the solid-state image sensor 10 to which the present technology is applied.

The first alternative example is obtained when a color filter (CF) 13 is additionally formed between the OCL 11 and the organic photoelectric conversion film 12 in the first configuration example depicted in FIG. 1.

Similar alternative examples to the above-described second to seventh configuration examples are also made available.

Figure 10:
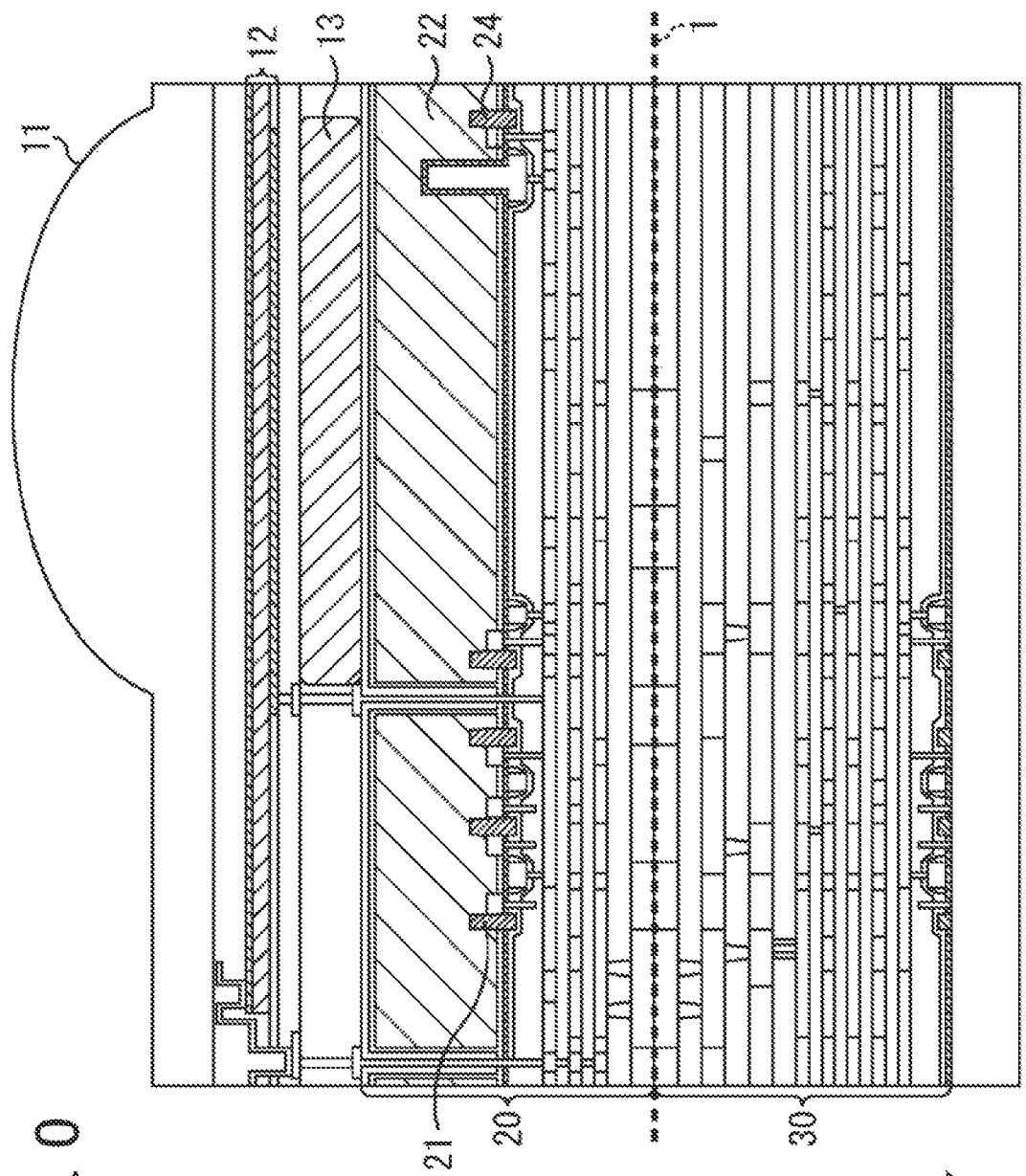
FIG. 10 is a cross-sectional diagram depicting a second alternative example to the first configuration example of the solid-state image sensor.

Second Alternative Example to the First Configuration Example of the Solid-State Image Sensor Embodying the Present Technology FIG. 10 is a cross-sectional diagram depicting a second alternative example to the first configuration example of the solid-state image sensor 10 to which the present technology is applied.

The second alternative example is obtained when the CF 13 is additionally formed between the organic photoelectric conversion film 12 and the PD 22 in the first configuration example depicted in FIG. 1.

Figure 11:
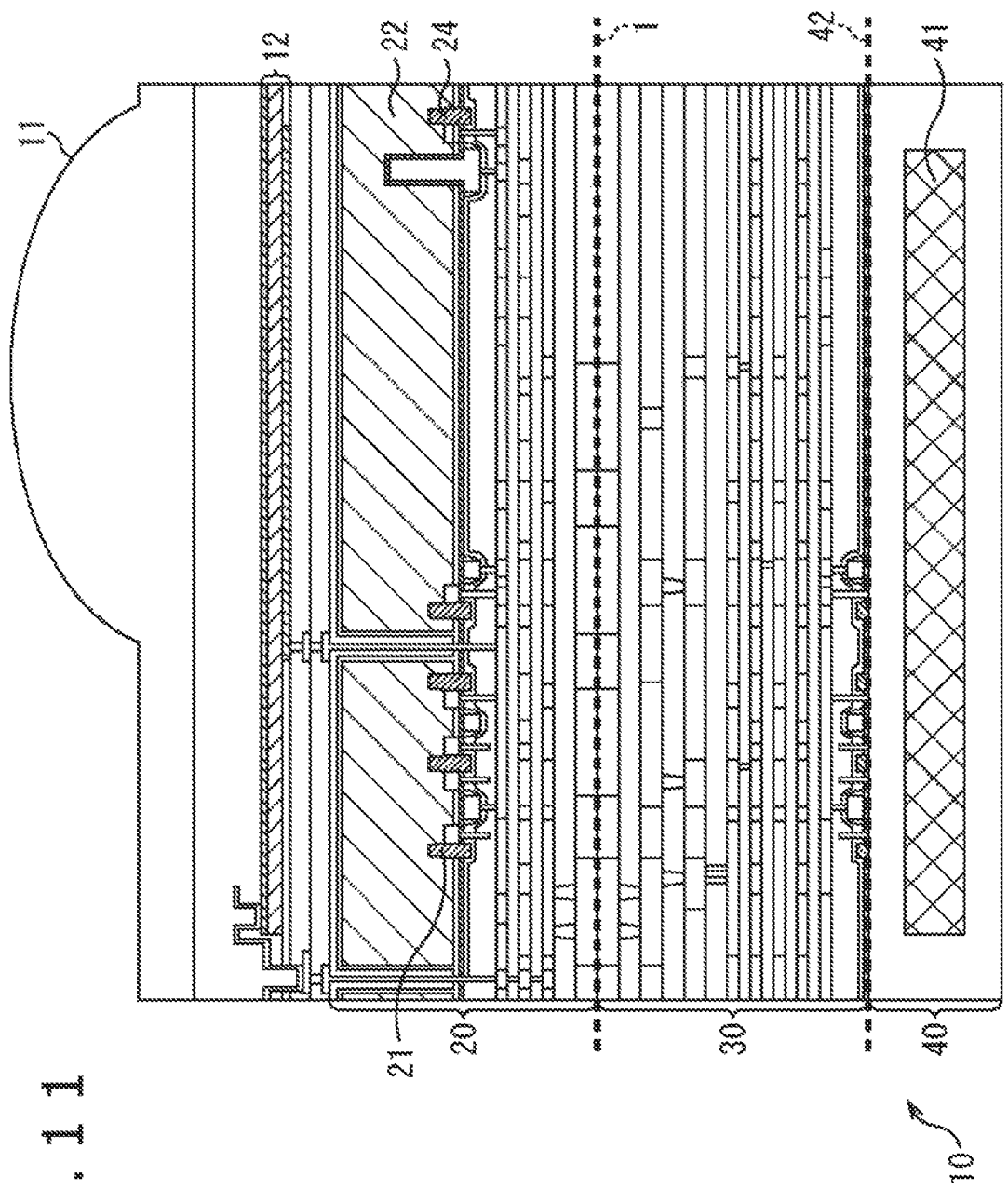
FIG. 11 is a cross-sectional diagram depicting a third alternative example to the first configuration example of the solid-state image sensor.

Third Alternative Example to the First Configuration Example of the Solid-State Image Sensor Embodying the Present Technology FIG. 11 is a cross-sectional diagram depicting a third alternative example to the first configuration example of the solid-state image sensor 10 to which the present technology is applied.

The third alternative example is obtained when a silicon substrate (third substrate) 40 is further stacked under the second substrate 30 in the first configuration example depicted in FIG. 1, with memories and other components formed on the third substrate 40. In this case, forming the memories on the added substrate can make the chip size smaller than in the case where the memories are disposed at designated locations around the pixels.

Figure 12:
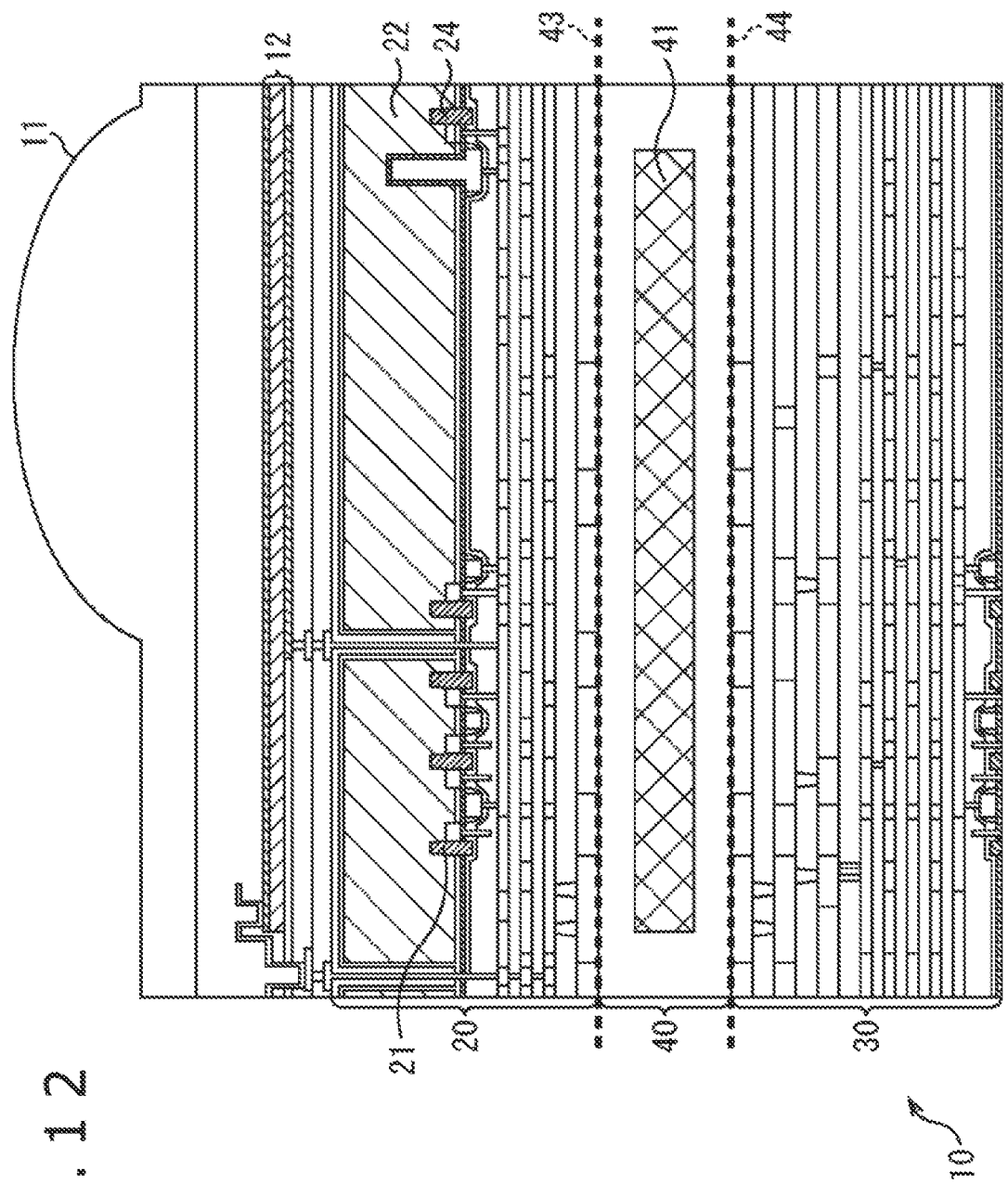
FIG. 12 is a cross-sectional diagram depicting a fourth alternative example to the first configuration example of the solid-state image sensor.

Fourth Alternative Example to the First Configuration Example of the Solid-State Image Sensor Embodying the Present Technology FIG. 12 is a cross-sectional diagram depicting a fourth alternative example to the first configuration example of the solid-state image sensor 10 to which the present technology is applied.

The fourth alternative example is obtained when the silicon substrate (third substrate) 40 is stacked between the first substrate 20 and the second substrate 30 in the first configuration example depicted in FIG. 1, with memories and other components formed on the third substrate 40. In this case, forming the memories on the added substrate can make the chip size smaller than in the case where the memories are disposed at designated locations around the pixels.

Similar alternative examples to the above-described second to seventh configuration examples are also made available.

Other Alternative Examples

In the above-described first to seventh configuration examples, the organic photoelectric conversion film 12 is formed on the first substrate 20 and the PD 22 is formed inside the first substrate 20. Alternatively, for example, two organic photoelectric conversion films 12 sensitive to two different wavelength bands may be formed on the first substrate 20, with the PD 22 formed inside the first substrate 20.

As another alternative, for example, three organic photoelectric conversion films 12 sensitive to three different wavelength bands may be formed on the first substrate 20, with the PD 22 omitted from inside the first substrate 20.

As a further alternative, for example, the organic photoelectric conversion film 12 may be formed on the first substrate 20 and two layers of PDs 22 may be formed inside the first substrate 20, the two layers of PDs 22 being sensitive to two different wavelength bands.

Those alternative examples above permit acquisition of all color components of three wavelength bands (R, G, B) from each pixel.

First Application Example

The technology of the present disclosure may be applied to varieties of products. For example, the technology of this disclosure may be applied to an in-vivo information acquisition system using a capsule type endoscope for a patient.

Figure 13:
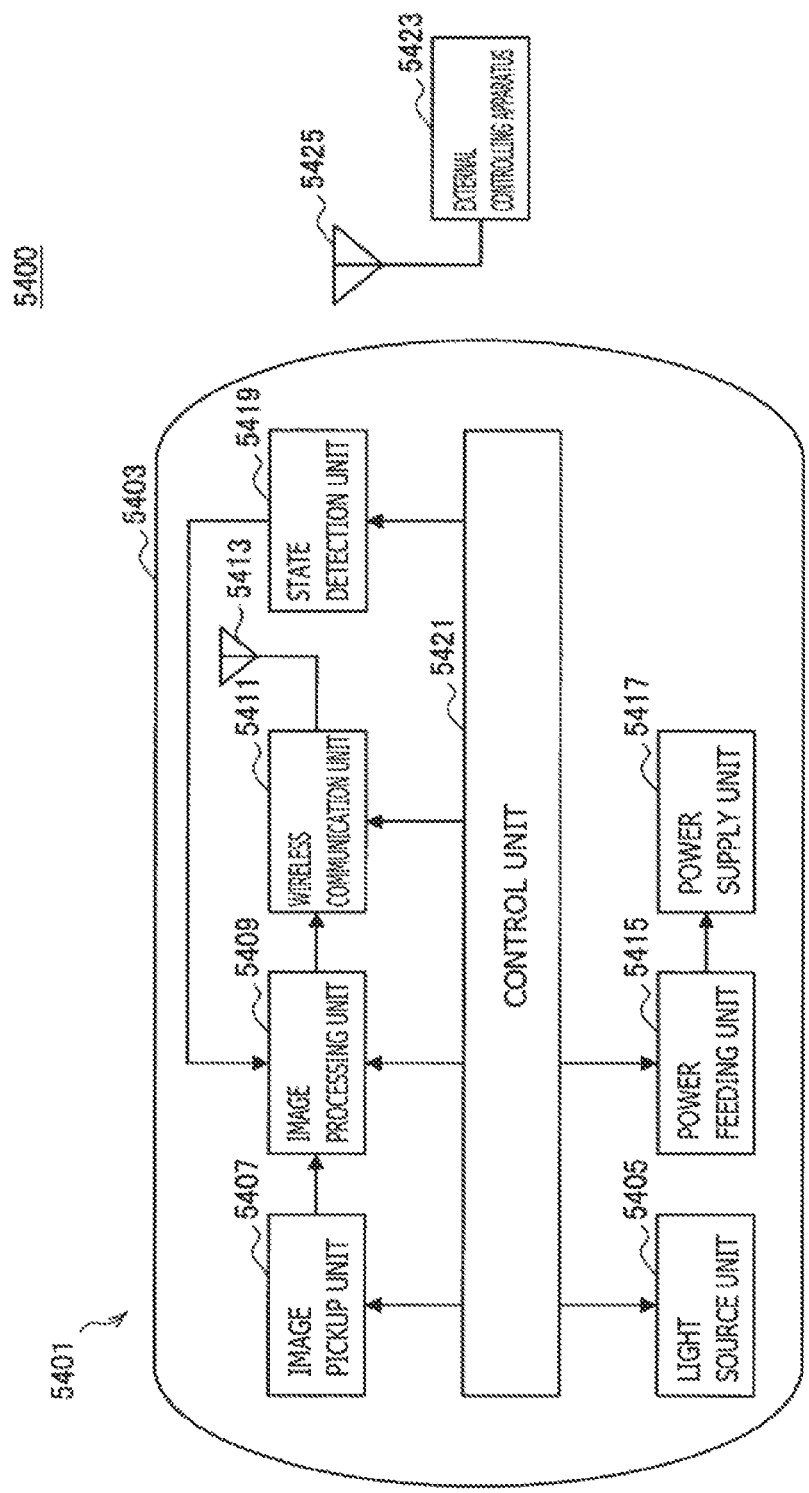
FIG. 13 is a block diagram depicting an example of a schematic configuration of an in-vivo information acquisition system.

FIG. 13 is a view depicting an example of a schematic configuration of an in-vivo information acquisition system 5400 to which the technology according to an embodiment of the present disclosure can be applied. Referring to FIG. 13, the in-vivo information acquisition system 5400 includes a capsule type endoscope 5401, and an external controlling apparatus 5423 which integrally controls operation of the in-vivo information acquisition system 5400. Upon inspection, the capsule type endoscope 5401 is swallowed by a patient. The capsule type endoscope 5401 has an image pickup function and a wireless communication function. For a period of time before the capsule type endoscope 5401 is discharged naturally from the patient, while it moves in the inside of an organ such as the stomach or the intestines by peristaltic motion, it successively picks up an image in the inside of each organ (hereinafter referred to as in-vivo image) at predetermined intervals and successively transmits information of the in-vivo images in wireless fashion to the external controlling apparatus 5423 located outside the body. The external controlling apparatus 5423 generates image data for displaying the in-vivo images on a display apparatus (not depicted) on the basis of the information of the received in-vivo images. In this manner, in the in-vivo information acquisition system 5400, a picked up image illustrating a state of the inside of the body of the patient can be obtained at any time after the capsule type endoscope 5401 is swallowed until it is discharged.

A configuration and functions of the capsule type endoscope 5401 and the external controlling apparatus 5423 are described in more detail. As depicted, the capsule type endoscope 5401 has functions of a light source unit 5405, an image pickup unit 5407, an image processing unit 5409, a wireless communication unit 5411, a power feeding unit 5415, a power supply unit 5417, a state detection unit 5419 and a control unit 5421 incorporated in a housing 5403 of the capsule type.

The light source unit 5405 includes a light source such as, for example, a light emitting diode (LED) and irradiates light upon an image pickup field of view of the image pickup unit 5407.

The image pickup unit 5407 includes an image pickup element and an optical system formed from a plurality of lenses provided at a preceding stage to the image pickup element. Reflected light (hereinafter referred to as observation light) of light irradiated upon a body tissue which is an observation target is condensed by the optical system and enters the image pickup element. The image pickup element receives and photoelectrically converts the observation light to generate an electric signal corresponding to the observation light, namely, an image signal corresponding to an observation image. The image signal generated by the image pickup unit 5407 is provided to the image processing unit 5409. It is to be noted that, as the image pickup element of the image pickup unit 5407, various publicly known image pickup elements such as a complementary metal oxide semiconductor (CMOS) image sensor or a charge coupled device (CCD) image sensor may be used.

The image processing unit 5409 includes a processor such as a central processing unit (CPU) or a graphics processing unit (GPU) and performs various signal processes for an image signal generated by the image pickup unit 5407. The signal processes may be minimal processes for transmitting an image signal to the external controlling apparatus 5423 (for example, compression of image data, conversion of the frame rate, conversion of the data rate, and/or conversion of the format). Since the image processing unit 5409 is configured so as to perform only the minimal processes, the image processing unit 5409 can be implemented in a smaller size with lower power consumption. Therefore, the image processing unit 5409 is suitable for the capsule type endoscope 5401. However, if the space in the housing 5403 or the power consumption affords, then the image processing unit 5409 may perform a further signal process (for example, a noise removal process or some other image quality improving process). The image processing unit 5409 provides an image signal, for which the signal processes have been performed, as RAW data to the wireless communication unit 5411. It is to be noted that, when information regarding a state (motion, posture or the like) of the capsule type endoscope 5401 is acquired by the state detection unit 5419, the image processing unit 5409 may provide an image signal in a tied manner with the information to the wireless communication unit 5411. This makes it possible to associate the position inside the body at which an image is picked up, an image pickup direction of the image or the like with the picked up image.

The wireless communication unit 5411 includes a communication apparatus which can transmit and receive various kinds of information to and from the external controlling apparatus 5423. The communication apparatus includes an antenna 5413, a processing circuit which performs a modulation process and so forth for transmission and reception of a signal, and so forth. The wireless communication unit 5411 performs a predetermined process such as a modulation process for an image signal for which the signal processes have been performed by the image processing unit 5409, and transmits the resulting image signal to the external controlling apparatus 5423 through the antenna 5413. Further, the wireless communication unit 5411 receives a control signal relating to driving control of the capsule type endoscope 5401 from the external controlling apparatus 5423 through the antenna 5413. The wireless communication unit 5411 provides the received control signal to the control unit 5421.

The power feeding unit 5415 includes an antenna coil for power reception, a power regeneration circuit for regenerating electric power from electric current generated in the antenna coil, a voltage booster circuit and so forth. The power feeding unit 5415 generates electric power using the so-called principle of non-contact charging. Specifically, if a magnetic field (electromagnetic wave) of a predetermined frequency is provided from the outside to the antenna coil of the power feeding unit 5415, then induced electromotive force is generated in the antenna coil. The electromagnetic wave may be a carrier transmitted from the external controlling apparatus 5423 through an antenna 5425, for example. Electric power is regenerated from the induced electromotive force by the power regeneration circuit, and the potential of the electric power is suitably adjusted by the voltage booster circuit to generate electric power for charging. The electric power generated by the power feeding unit 5415 is stored into the power supply unit 5417.

The power supply unit 5417 includes a secondary battery and stores electric power generated by the power feeding unit 5415. In FIG. 13, in order to avoid complicated illustration, an arrow mark indicative of a supplying destination of electric power from the power supply unit 5417 and so forth are not depicted. However, electric power stored in the power supply unit 5417 is supplied to the light source unit 5405, the image pickup unit 5407, the image processing unit 5409, the wireless communication unit 5411, the state detection unit 5419 and the control unit 5421 and can be used for driving of them.

The state detection unit 5419 includes a sensor for detecting a state of the capsule type endoscope 5401 such as an acceleration sensor and/or a gyro sensor. The state detection unit 5419 can acquire information relating to a state of the capsule type endoscope 5401 from a result of detection by the sensor. The state detection unit 5419 provides the acquired information regarding a state of the capsule type endoscope 5401 to the image processing unit 5409. The image processing unit 5409 can tie the information regarding a state of the capsule type endoscope 5401 with an image signal as described hereinabove.

The control unit 5421 includes a processor such as a CPU and operates in accordance with a predetermined program to integrally control operation of the capsule type endoscope

5401. The control unit 5421 suitably controls driving of the light source unit 5405, the image pickup unit 5407, the image processing unit 5409, the wireless communication unit 5411, the power feeding unit 5415, the power supply unit 5417 and the state detection unit 5419 in accordance with a control signal transmitted thereto from the external controlling apparatus 5423 to implement such functions of the components as described above.

The external controlling apparatus 5423 may be a processor such as a CPU or a GPU, a microcomputer or a control board in which a processor and a storage element such as a memory are mixedly incorporated. The external controlling apparatus 5423 is configured such that it has an antenna 5425 and can transmit and receive various kinds of information to and from the capsule type endoscope 5401 through the antenna 5425. Specifically, the external controlling apparatus 5423 transmits a control signal to the control unit 5421 of the capsule type endoscope 5401 to control operation of the capsule type endoscope 5401. For example, an irradiation condition of light upon an observation target of the light source unit 5405 can be changed in accordance with a control signal from the external controlling apparatus 5423. Further, an image pickup condition (for example, a frame rate, an exposure value or the like of the image pickup unit 5407) can be changed in accordance with a control signal from the external controlling apparatus 5423. Further, the substance of processing by the image processing unit 5409 or a condition for transmitting an image signal from the wireless communication unit 5411 (for example, a transmission interval, a transmission image number or the like) may be changed in accordance with a control signal from the external controlling apparatus 5423.

Further, the external controlling apparatus 5423 performs various image processes for an image signal transmitted from the capsule type endoscope 5401 to generate image data for displaying a picked up in-vivo image on the display apparatus. As the image processes, various publicly known signal processes may be performed such as, for example, a development process (demosaic process), an image quality improving process (bandwidth enhancement process, super-resolution process, noise reduction (NR) process, and/or image stabilization process) and/or an enlargement process (electronic zoom process) or the like. The external controlling apparatus 5423 controls driving of the display apparatus (not depicted) to cause the display apparatus to display a picked up in-vivo image on the basis of generated image data. Alternatively, the external controlling apparatus 5423 may control a recording apparatus (not depicted) to record generated image data or control a printing apparatus (not depicted) to output generated image data by printing.

Explained above is the typical in-vivo information acquisition system 5400 to which the technology of the present disclosure may be applied. The technology of this disclosure can be applied advantageously to the image pickup unit 5407 in the above-described configuration.

Second Application Example

The technology of the present disclosure may be implemented, for example, as an apparatus to be mounted on any one type of mobile objects such as automobiles, electric vehicles, hybrid electric vehicles, motorcycles, bicycles, personal mobility devices, aircraft, drones, ships, robots, construction equipment, and agricultural machinery (tractors).

Figure 14:
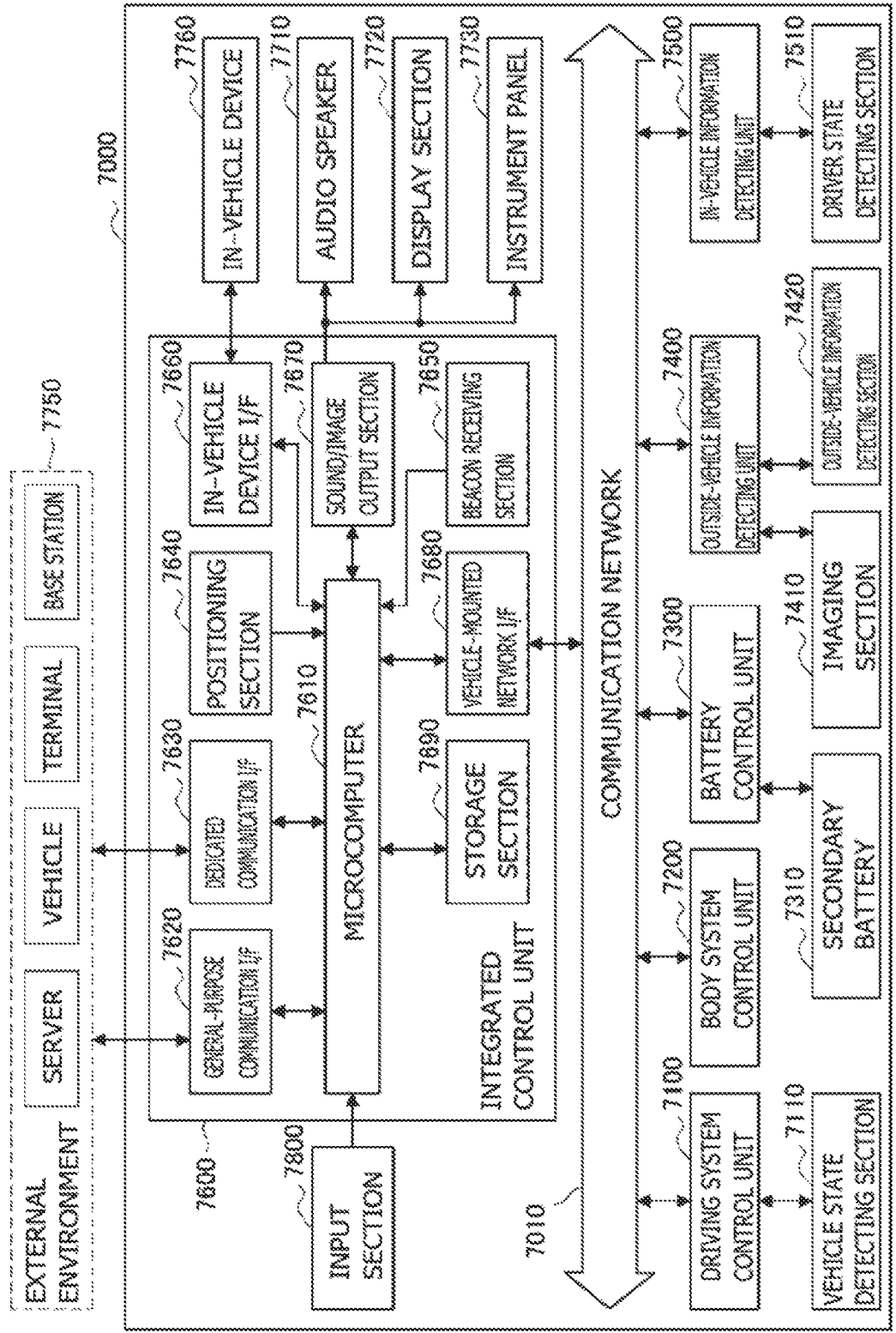
FIG. 14 is a block diagram depicting an example of schematic configuration of a vehicle control system.

FIG. 14 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 14, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or wireless communication. A functional configuration of the integrated control unit 7600 illustrated in FIG. 14 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, or sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions or a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 15:
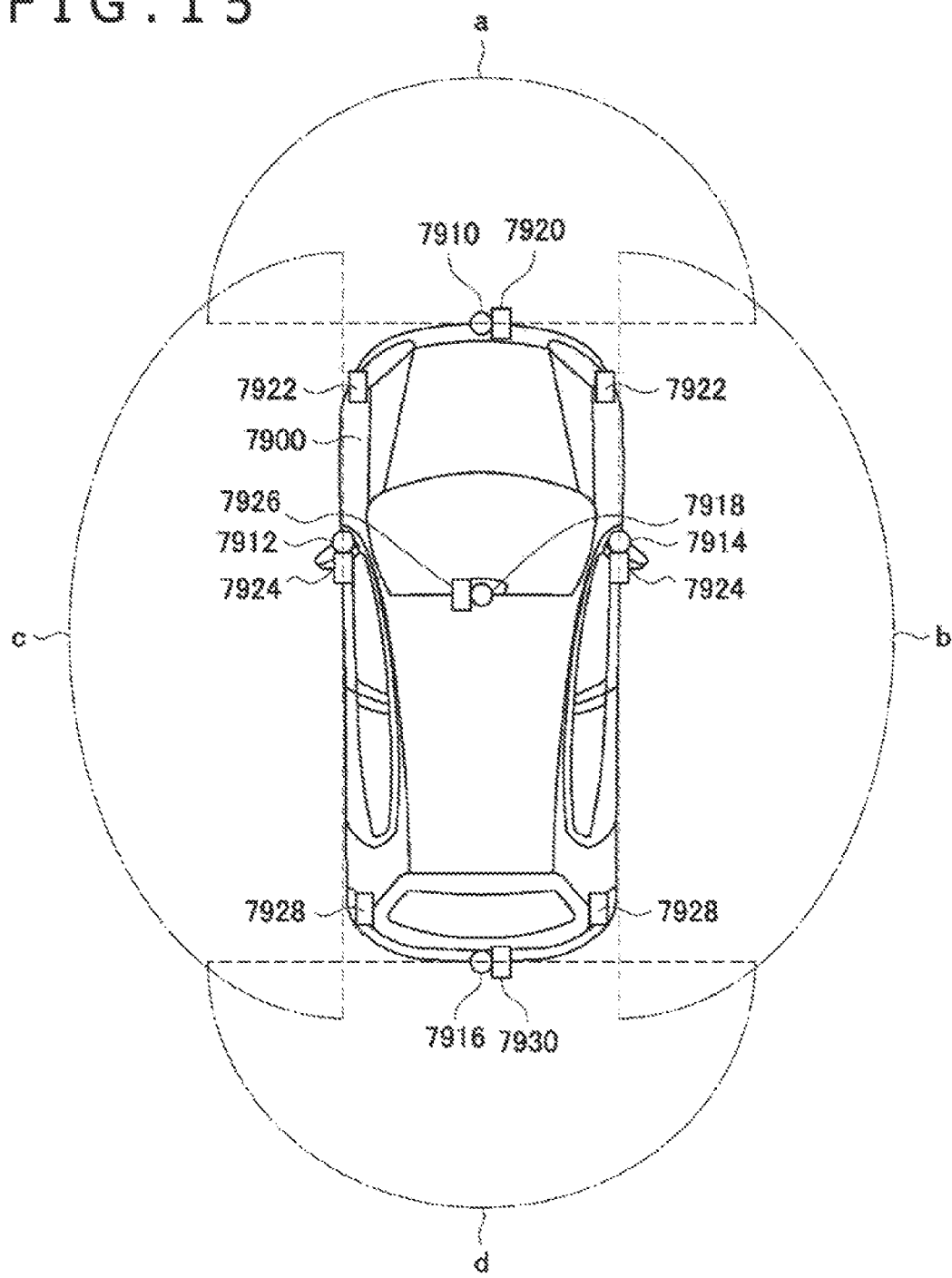
FIG. 15 is a diagram explaining an example of installation positions of an outside-vehicle information detecting section and an imaging section.

FIG. 15 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 14, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 permits transmission of an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by different imaging sections 7410 to generate a bird's-eye image or a panoramic image. The outside-vehicle information detecting unit 7400 may perform viewpoint conversion processing using the image data imaged by the different imaging sections 7410.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800 and outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM), WiMAX, long term evolution (LTE)), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of IEEE 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless USB (WUSB). In addition, the in-vehicle device I/F 7660 may establish wired connection by universal serial bus (USB), high-definition multimedia interface (HDMI), mobile high-definition link (MHL), or the like via a connection terminal (and a cable if necessary) not depicted in the figures. The in-vehicle devices 7760 may, for example, include at least one of a mobile device or a wearable device possessed by an occupant or an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automatic driving, which makes the vehicle to travel autonomously without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 14, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 14 may be integrated into one control unit. Alternatively, each individual control unit may include multiple control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and multiple control units may mutually transmit and receive detection information via the communication network 7010.

In the above-described vehicle control system 7000, the image sensor 10 embodying the present technology may be used in the imaging section 7410 of the application example depicted in FIG. 14.

The embodiments of the present disclosure are not limited to those described above and may be modified or altered diversely within the scope and spirit of this disclosure.

The present technology may be implemented in the following configurations:

(1)

A solid-state image sensor including:

a first substrate and a second substrate configured to be stacked one on top of the other; and a first organic photoelectric conversion film configured to be formed on the first substrate;

in which the second substrate has a latch circuit formed thereon.

(2)

The solid-state image sensor as stated in paragraph (1) above, further including:

a photoelectric conversion section configured to be sensitive to a wavelength band different from another wavelength band to which the first organic photoelectric conversion film is sensitive.

(3)

The solid-state image sensor as stated in paragraph (2) above, in which the photoelectric conversion section includes a second organic photoelectric conversion film sensitive to a wavelength band different from the wavelength band to which the first organic photoelectric conversion film is sensitive, and is formed on the first substrate.

(4)

The solid-state image sensor as stated in paragraph (2) above, in which the photoelectric conversion section includes a PD sensitive to a wavelength band different from the wavelength band to which the first organic photoelectric conversion film is sensitive, and is formed inside the first substrate.

(5)

The solid-state image sensor as stated in any one of paragraphs (1) to (4) above, in which a pixel transistor corresponding to the first organic photoelectric conversion film is formed inside the first substrate.

(6)

The solid-state image sensor as stated in any one of paragraphs (1) to (5) above, in which an ADC circuit corresponding to the first organic photoelectric conversion film is formed inside the first substrate.

(7)

The solid-state image sensor as stated in paragraph (6) above, in which the pixel transistor and the ADC circuit corresponding to the first organic photoelectric conversion film are used exclusively by a single pixel.

(8)

The solid-state image sensor as stated in paragraph (6) above, in which the pixel transistor and the ADC circuit corresponding to the first organic photoelectric conversion film are shared by multiple pixels.

(9)

The solid-state image sensor as stated in any one of paragraphs (1) to (8) above, in which the pixel transistor corresponding to the first organic photoelectric conversion film includes a reset transistor, an amplification transistor, and a selection transistor.

(10)

The solid-state image sensor as stated in paragraph (9) above, in which the reset transistor is configured to operate by a GND RST scheme.

(11)

The solid-state image sensor as stated in paragraph (9) above, in which the reset transistor is configured to operate by a Vdd RST scheme.

(12)

The solid-state image sensor as stated in any one of paragraphs (9) to (11) above, in which the pixel transistor corresponding to the first organic photoelectric conversion film further includes a transfer transistor.

(13)

The solid-state image sensor as stated in paragraph (12) above, in which the transfer transistor is formed for each pixel, and in which the reset transistor, the amplification transistor, and the selection transistor are shared by multiple pixels.

(14)

The solid-state image sensor as stated in any one of paragraphs (1) to (13) above, further including:

a third substrate stacked on a side of the second substrate.

(15)

An electronic apparatus including:

a solid-state image sensor, in which the solid-state image sensor includes a first substrate and a second substrate configured to be stacked one on top of the other, and a first organic photoelectric conversion film configured to be formed on the first substrate, and in which the second substrate has a latch circuit formed thereon.

REFERENCE SIGNS LIST

10 Solid-state image sensor
11 On-chip lens (OCL)
12 Organic photoelectric conversion film
13 Color filter (CF)
20 First substrate
21 Pixel transistor (Tr.)
22 Photodiode (PD)
24 Pixel transistor (Tr.)
30 Second substrate
31 ADC circuit
32 ADC circuit

The invention claimed is:

1. A solid-state image sensor, comprising:
a first substrate;
a second substrate stacked on the first substrate;
a first organic photoelectric conversion film on the first substrate, wherein
the first organic photoelectric conversion film is sensitive to a first wavelength band, and
the second substrate comprises a latch circuit;
a photoelectric conversion section configured to include a photodiode (PD), wherein
the PD is inside the first substrate,
the PD is sensitive to a second wavelength band different from the first wavelength band, and
both the first wavelength band and the second wavelength band are color wavelength bands; and
a pixel transistor corresponding to the first organic photoelectric conversion film, wherein
the pixel transistor includes a transfer transistor.

2. The solid-state image sensor according to claim 1, wherein
the photoelectric conversion section includes a second organic photoelectric conversion film,
the second organic photoelectric conversion film is sensitive to a third wavelength band different from the first wavelength band to which the first organic photoelectric conversion film is sensitive, and
the second organic photoelectric conversion film is formed on the first substrate.

3. The solid-state image sensor according to claim 1, wherein the pixel transistor is inside the first substrate.

4. The solid-state image sensor according to claim 3, further comprises an analog-to-digital circuit (ADC) circuit corresponding to the first organic photoelectric conversion film, wherein the ADC circuit is inside the first substrate.

5. The solid-state image sensor according to claim 4, wherein the pixel transistor and the ADC circuit, corresponding to the first organic photoelectric conversion film, are shared by a plurality of pixels.

6. The solid-state image sensor according to claim 3, wherein the pixel transistor includes a reset transistor, an amplification transistor, and a selection transistor.

7. The solid-state image sensor according to claim 6, wherein the reset transistor is configured to operate by a ground (GND) reset (RST) scheme.

8. The solid-state image sensor according to claim 6, wherein the reset transistor is configured to operate by a Vdd reset (RST) scheme.

9. The solid-state image sensor according to claim 6, wherein
the transfer transistor is for each pixel of a plurality of pixels, and
the reset transistor, the amplification transistor, and the selection transistor are shared by the plurality of pixels.

10. The solid-state image sensor according to claim 1, further comprising: a third substrate stacked on a side of the second substrate.

11. An electronic apparatus, comprising:
a solid-state image sensor including:
a first substrate;
a second substrate stacked on the first substrate;
a first organic photoelectric conversion film on the first substrate, wherein the first organic photoelectric conversion film is
   sensitive to a first wavelength band, and
the second substrate comprises a latch circuit; and
a photoelectric conversion section configured to include a
   photodiode (PD), wherein
   the PD is inside the first substrate, and
   the PD is sensitive to a second wavelength band
   different from the first wavelength band; and
a pixel transistor corresponding to the first organic photoelectric conversion film, wherein the pixel transistor includes a transfer transistor.

* * * * *